United States Patent
Fuller et al.

(10) Patent No.: US 10,497,866 B1
(45) Date of Patent: Dec. 3, 2019

(54) IONIC FLOATING-GATE MEMORY DEVICE

(71) Applicant: National Technology & Engineering Solutions of Sandia, LLC, Albuquerque, NM (US)

(72) Inventors: Elliot James Fuller, Dublin, CA (US); Sapan Agarwal, Dublin, CA (US); Albert Alec Talin, Dublin, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 43 days.

(21) Appl. No.: 16/012,430

(22) Filed: Jun. 19, 2018

(51) Int. Cl.
*H01L 21/00* (2006.01)
*H01L 45/00* (2006.01)
*H01L 27/24* (2006.01)
*G11C 13/00* (2006.01)

(52) U.S. Cl.
CPC ...... *H01L 45/1206* (2013.01); *H01L 27/2427* (2013.01); *G11C 13/0007* (2013.01); *G11C 13/0009* (2013.01)

(58) Field of Classification Search
CPC ............. H01L 45/1206; H01L 27/2427; G11C 13/0009
See application file for complete search history.

(56) References Cited

U.S. PATENT DOCUMENTS

| | | | |
|---|---|---|---|
| 6,091,621 A | 7/2000 | Wang et al. | |
| 6,806,511 B2* | 10/2004 | Armgarth | B82Y 10/00 257/197 |
| 7,345,934 B2 | 3/2008 | Guterman et al. | |
| 7,547,599 B2* | 6/2009 | Sandhu | H01L 29/66825 438/257 |
| 7,915,603 B2* | 3/2011 | Kreupl | G11C 13/0004 257/148 |
| 8,183,665 B2* | 5/2012 | Bertin | B82Y 10/00 257/529 |
| 9,831,427 B1* | 11/2017 | Haase | H01L 45/12 |
| 10,020,346 B2* | 7/2018 | Bedau | H01L 45/08 |
| 10,392,243 B2* | 8/2019 | Almeida Loya | B81B 7/008 |
| 10,424,751 B2* | 9/2019 | Doris | H01L 51/0035 |
| 10,429,343 B1* | 10/2019 | Talin | |
| 2009/0026438 A1 | 1/2009 | Lin | |
| 2012/0313070 A1 | 12/2012 | Williams et al. | |
| 2016/0172027 A1* | 6/2016 | Tahmasebian | G11C 13/0016 257/40 |
| 2019/0131555 A1* | 5/2019 | Doris | H01L 51/0508 |
| 2019/0305046 A1* | 10/2019 | Jha | H01L 45/1206 |
| 2019/0305220 A1* | 10/2019 | Jha | G11C 13/004 |

* cited by examiner

*Primary Examiner* — Laura M Menz
(74) *Attorney, Agent, or Firm* — Medley, Behrens & Lewis, LLC

(57) ABSTRACT

A non-volatile memory device is described herein. The non-volatile memory device includes a diffusive memristor electrically coupled to a redox transistor. The redox transistor includes a gate, a source, and a drain, wherein the gate comprises a first storage element that acts as an ion reservoir, and a channel between the source and the drain comprises a second storage element, wherein a state of the memory device is represented by conductance of the second storage element.

13 Claims, 7 Drawing Sheets

IONIC FLOATING-GATE MEMORY DEVICE

STATEMENT OF GOVERNMENTAL INTEREST

This invention was made with Government support under Contract No. DE-NA0003525 awarded by the United States Department of Energy/National Nuclear Security Administration. The U.S. Government has certain writes in the invention.

BACKGROUND

Conventional processor-readable non-volatile memory, such as FLASH, use transistors to store binary values ("0" or "1"). A deficiency with conventional non-volatile memory technologies is that a relatively high voltage is required to program elements of the memory (e.g., to transition state of a memory element from 0 to 1 or from 1 to 0). Specifically, approximately 10V is required to program a conventional FLASH memory element. With respect to mobile computing devices, such as laptop computing devices, tablet computing devices, mobile telephones, etc., use of this relatively large amount of voltage to program memory of such computing devices acts as a drain on a battery used to power these devices. In addition, with respect to conventional non-volatile memory elements used in conventional computing devices, these memory elements are difficult to scale, such that each memory element can have more than two states. As noted above, most conventional memory devices are binary. Some designs have been proposed that allow for a memory element to have multiple states—however, the number of states is relatively limited (e.g., four states instead of two).

Furthermore, conventional non-volatile memory elements are ill-suited for utilization in neuromorphic computing applications. Neuromorphic computers are configured to perform core matrix operations for neural network algorithms in parallel and within one computing cycle. When executing neural network algorithms, neuromorphic computers can theoretically overcome efficiency bottlenecks that are inherent to digital computers by using analog memory to both process and store weights in a neural network. Some analog memory devices have been proposed for use in neuromorphic computers. For instance, Resistive Random-Access Memory (RRAM) and phase change memory (PCM) have been proposed for use in neuromorphic computers. RRAM or PCM, however, require large voltages and large currents to program, and are additionally associated with non-linear programming, wherein a write operation from a first state to a second state gives a change in analog level, while altering from a second state to a third state etc. gives a significantly different change in analog level. Linear programming (where the change in resistance due to a write operation is independent of initial resistance) is needed for programming accuracy to support massively parallel training via an outer product update. Nonlinear RRAM or PCM devices cannot write "blind" and, instead, require feedback mechanisms in order to achieve accuracy, which sacrifices the underlying parallelism needed for energy-efficient training.

Using any two-terminal device (such as PCM or RRAM) for neuromorphic computing, faces a fundamental challenge because read and write functions of such types of memory are coupled through the same path and, therefore, are subject to the time-voltage dilemma. The activation energy for switching must be $E_a > 10$ kT to preserve retention and prevent read disturb. In such case, a large, thermally activated barrier results in a super-exponential dependence of the programming current on the applied voltage, which leads to high voltages and currents that prevent scaling to arrays larger than approximately 100×100, and further contributes to nonlinear programming that reduces accuracy. Specifically, neither RRAM or PCM memory can achieve the high impedance required for scaling to arrays larger than 100× 100 elements and simultaneously achieve the accuracy necessary for computation Crossbar arrays larger than 1000× 1000 are required to balance out the costs of circuit overheads. Due to such limitations, then, proposed analog training accelerators composed of two-terminal devices, such as RRAM and PCM, have yet to achieve energy-efficient gains over complementary metal oxide semiconductors (CMOS).

SUMMARY

The following is a brief summary of subject matter that is described in greater detail herein. This summary is not intended to be limiting as to the scope of the claims.

Described herein are various technologies pertaining to a non-volatile memory device that is well-suited for use in neuromorphic computing; such memory device is referred to herein as an Ionic Floating Gate (IFG) memory device. The IFG memory device described herein is also well-suited for use in conventional computing devices, such as mobile telephones, laptop computing devices, desktop computing devices, server computing devices employed in data centers, tablet computing devices, enterprise server computing devices, etc.

The IFG memory device comprises a switch that is electrically coupled to a redox transistor. In an example, the switch is a nano-electrochemical and electromechanical switch. In a more specific example, the switch can be a diffusive memristor, wherein the diffusive memristor is a type of volatile conductive-bridge memory that uses silver ion migration for filamentary switch formation with fast diffusive formation and dissolution. The diffusive memristor can be optimized to execute fast switching at low voltage while retaining a large ON/OFF ratio. The redox transistor includes a gate electrode that is coupled to the switch, a source electrode, and a drain electrode. Pursuant to an example, the gate electrode is configured to store ions (e.g., positive hydrogen ions), emit ions responsive to electrons being removed from the gate electrode, and accept ions responsive to electrons being provided to the gate electrode. The redox transistor also includes a channel electrode between the source electrode and the drain electrode. Like the gate electrode, the channel electrode is configured to store ions, emit ions responsive to releasing electrons, and accept ions responsive to accepting electrons.

The gate electrode, channel electrode and solid electrolyte together comprise an electrochemical redox cell, similar to a battery. The gate electrode is separated from the channel electrode by an electrically insulating solid electrolyte, wherein the solid electrolyte prevents electrons from passing between the gate electrode and the channel electrode via the solid electrolyte, but allows ions to pass between the gate electrode and channel electrode via the solid electrolyte. Thus, when a voltage is applied to the gate electrode to remove an electron, the charge imbalance is compensated by a positively charged ion entering the gate electrode from the solid electrolyte through a reaction at the solid electrolyte gate interface and the gate is oxidized. The electron removed from the gate flows through an external circuit to the channel electrode. To compensate for the charge imbalance the channel electrode releases a positive ion into the solid electrolyte through a redox reaction at the channel electrode solid electrolyte interface and the channel electrode is reduced. The process can be reversed and ions can be transported back from the gate to the channel whereby the gate is reduced and the channel is oxidized.

A state of the IFG memory device is a function of the oxidation state of the channel electrode (e.g., as the number of ions changes in the channel electrode). The resistance of the gate electrode changes as a function of the oxidation state, and the state of the IFG memory device can be read by generating a reading of resistance of the channel electrode. Therefore, by causing the channel electrode to accept or release ions, the state of the memory device can be altered. Because the gate and channel electrodes store the ions throughout their bulk volume, the IFG memory device can have much larger number of states compared to devices that rely upon storing charges at interfaces (field effect transistors) or in trap states (FLASH type memory).

Further, as will be described in greater detail herein, the IFG memory device is a three-terminal device, and is programmed on a first line and read on a second line. This allows the IFG memory device to be well-suited for use in a neuromorphic computer because it allows for low voltage operation at every terminal. The neuromorphic computer can include a matrix of such memory devices, which are coupled together in a modified crossbar arrangement (where a conventional crossbar arrangement is modified to account for the different read and write lines). The IFG memory device described herein, when used in a neuromorphic computer, is well-suited for performing an outer product update (the matrix operation that is core to the backpropagation algorithm that is used to train neural networks), and is further well-suited for performing a multiply and accumulate operation (the core matrix operation for forward propagation when artificial neural networks are used to generate output).

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
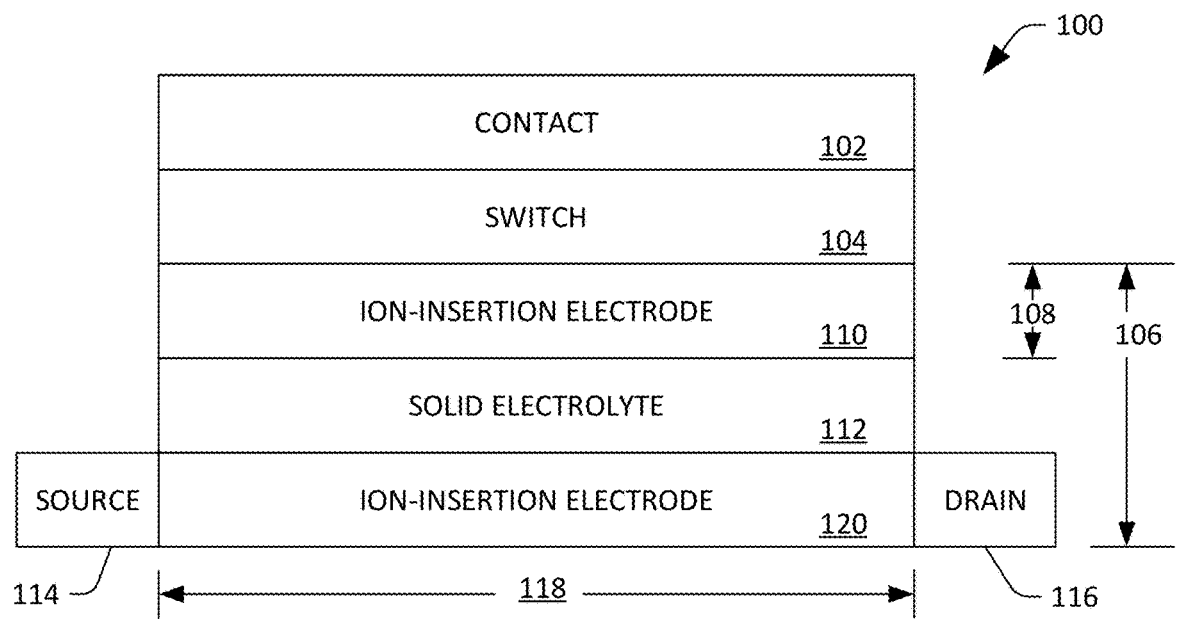
FIG. 1 is a functional block diagram of an exemplary IFG memory device.

Various technologies pertaining to a memory device that is well-suited for use in neuromorphic computing applications are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

A non-volatile memory device is described, which is referred to herein as an ionic floating-gate (IFG) memory device. The IFG memory device has various attributes that render it well-suited for utilization in neuromorphic computing applications. Specifically, the IFG memory device is programmable to have multiple different states, and is further linearly programmable (e.g., the state is represented by resistance of a channel in the IFG device, and the resistance is linearly correlated with the number of voltage pulses employed in connection with programming the IFG device). Moreover, the IFG memory device has three terminals, and different lines are employed to program the IFG memory device and read from the IFG memory device. This renders the ionic floating-gate memory device particularly well-suited for inclusion in a neuromorphic computer, where a matrix of IFG memory devices can be coupled together utilizing a modified crossbar arrangement to represent a neural network.

With reference now to FIG. 1, a block diagram of an exemplary IFG memory device 100 is illustrated. The IFG memory device 100 comprises a contact 102, a switch 104 that is electrically coupled to the contact 102, and a redox transistor 106 that is electrically coupled to the switch 104. The switch 104 can be a nano electrochemical and electromechanical switch, which is configured to be in a default open state and can be closed responsive to a voltage pulse with a relatively short duration and low magnitude being applied to the switch 104 by way of the contact 102. For example, the switch 104 can be transitioned from an open state to a closed state in response to receipt of a voltage pulse having a magnitude of approximately 0.4V. In a more specific example, the switch 104 can be a diffusive memristor that is composed of a Pt/Ag/SiO$_x$N$_y$/Ag/Pt stack. In such an example, the diffusive memristor can be optimized to execute fast switching at low voltage while retaining a large ON/OFF ratio. In other examples, the switch 104 can be a two-terminal or a three-terminal threshold switch with a sharp voltage threshold for turn-ON and high ON/OFF ratio. For instance, the switch 104 can be a transistor, a vertical Si transistor, a Si PN diode, a Si Punchthrough diode, an Oxide PN diode, Oxide/Nitride Schottky barriers, a varistor-type bidirectional switch (multilayer oxide barrier), a chalcogenide threshold switch, a metal insulator metal switch (tunnel barrier), a threshold vacuum switch, a mixed ionic electronic selector (MIEC)

The redox transistor 106 comprises a gate 108 (which may be referred to as a floating-gate), wherein, in an example, the gate 108 can be or include a first storage element 110, wherein the first storage element 110 is formed of an electrically-conductive material, and is configured to store, emit, and accept ions (e.g., positive hydrogen ions). Such material, in an example, can be a metal oxide, such as a transition metal oxide. In other examples, the material can comprise at least one of $MoO_3$, $MoS_2$, graphene, $WO_3$, $TiO_2$, or $LiTiO_2$. In addition, the redox transistor 106 comprises a solid electrolyte 112 that is positioned adjacent to (and in contact with) the first storage element 110. The solid electrolyte 112 is an electrical insulator that is configured to prevent electrons from passing therethrough but is configured to allow ions to pass through. For instance, the solid electrolyte 112 can be composed of Nafion, although many other materials are contemplated.

The redox transistor 106 additionally comprises a source 114, a drain 116, and a channel 118 that extends between the source 114 and the drain 116. The channel 118 comprises a second storage element 120, wherein the second storage element 120 can be formed of the same material as the first storage element 110. Additionally, like the first storage element 110, the second storage element 120 is configured to store, accept, and emit ions. The solid electrolyte 112 is adjacent to (in contact with) the second storage element 120. Accordingly, the solid electrolyte 112 prevents electrons from passing between the first storage element 110 and the second storage element 120 by way of the solid electrolyte 112, while the solid electrolyte 112 allows ions to pass between the first storage element 110 and the second storage element 120 by way of the solid electrolyte 112.

As indicated above, the first storage element 110 and the second storage element 120 can be formed of a same material, although the storage elements 110 and 120 may also be formed of different materials. For instance, such material may be material commonly used as cathode materials in batteries. Further, the storage elements 110 and 120 may each be composed of an organic polymer. An exemplary organic polymer from which the storage elements 110 and 120 can be composed includes a polymer PEDOT:PSS/PEI blend; hence, the storage elements 110 and 120 can comprise poly(3,4-ethylenedioxythiophene) polystyrene sulfonate. The first and second storage elements 110 and 120 can comprise other organic polymers, such as (but not limited to) NDI-2T copolymer.

Exemplary operation of the ionic floating-gate memory device 100 is now set forth. A voltage pulse from a voltage source (not shown) is applied to the contact 102, and is thus applied to the switch 104. As indicated previously, the magnitude of the voltage pulse applied to the switch 104 can be relatively low, such as between 0.2 and 0.5V, from between 0.2 and 0.8V, from between 0.2 and 1.0V, etc. When the switch 104 is a diffusive memristor, responsive to such voltage being applied to the switch 104, a filament is formed, thereby transitioning the diffusive memristor from an open (OFF) state to a closed (ON) state. Responsive to the diffusive memristor being transitioned to the ON the state, current flows through the diffusive memristor to the floating gate 108 of the device 100. This current drives ion-exchange between the floating-gate 108 (and more specifically, the first storage element 110) and the channel 118 (and more specifically, the second storage element 120). In such case, resistance switching occurs to the reversible insertion/extraction of protons into/from the channel 118 that acts to modulate the bulk channel doping. Effectively, then, as voltage is applied to the switch 104, current enters or exits the floating gate 108, driving exchange of ions between the first storage element 110 to the second storage element 120 across the solid electrolyte 112. While not shown, a line that electrically connects the first storage element 110 and the second storage element 120 via the switch 104 allows for electrons to pass between such storage elements 110 and 120 to balance the exchange of ions.

When voltage is no longer applied to the switch 104, the switch transitions to the OFF state (e.g., the filament in the diffusive memristor dissolves) and the redox transistor 106 is electrically insulated from further reactions, thereby preserving its conductance state. Put differently, once voltage is no longer applied to the switch 104, ions are respectively restricted to their respective storage elements 110 or 120, wherein a state of the IFG memory device 100 is a function of a redox state of the second storage element 120 at a given time. As the redox state changes in the second storage element, the conductance of the second storage element 120 also changes, and accordingly, a state of the IFG memory device 100 is a function of the conductance (resistance) of the channel 118.

It can therefore be ascertained that the first storage element 110 acts as a reservoir of ions, wherein ions can be extracted from the first storage element 110 and placed in the second storage element 120. Additionally, the first storage element 110 can be configured to accept ions emitted from the second storage element. To read the IFG memory device 100, a measure of resistance can be obtained between the source 114 and the drain 116. Further, as will be described in greater detail below, ion exchange between the first storage element 110 and the second storage element can be controlled relatively granularly due to the linear relationship between voltage applied to the switch 104 and a volume of ions that transition across the solid electrolyte 112 in response to the voltage being applied to the switch 104. Accordingly, the IFG memory device 100 can have several states. For instance, the IFG memory device 100 may have between four states and 100 states. In another example, the IFG memory device 100 may have between 50 states and 200 states. In still another example, the IFG memory device 100 may have between 200 and 1000 states. In yet another example, the IFG memory device 100 can be considered a purely analog non-volatile memory device.

Figure 2:
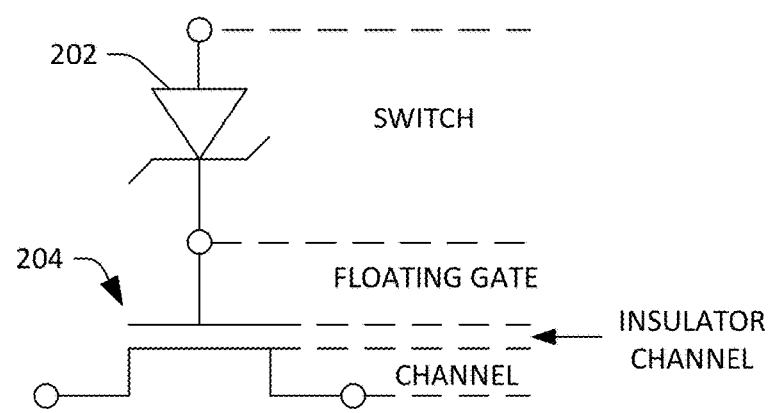
FIG. 2 is a schematic illustrating a circuit equivalent of the IFG memory device shown in FIG. 1.

Now referring to FIG. 2, a schematic illustrating a circuit 200 is illustrated, wherein the circuit 200 represents the IFG memory device 100 illustrated in FIG. 1. The circuit 200 includes a diode 202 that is electrically coupled to a capacitor 204. The diode 202 represents the switch 104. The floating-gate insulator channel and channel are represented by the capacitor 204.

Figure 3:
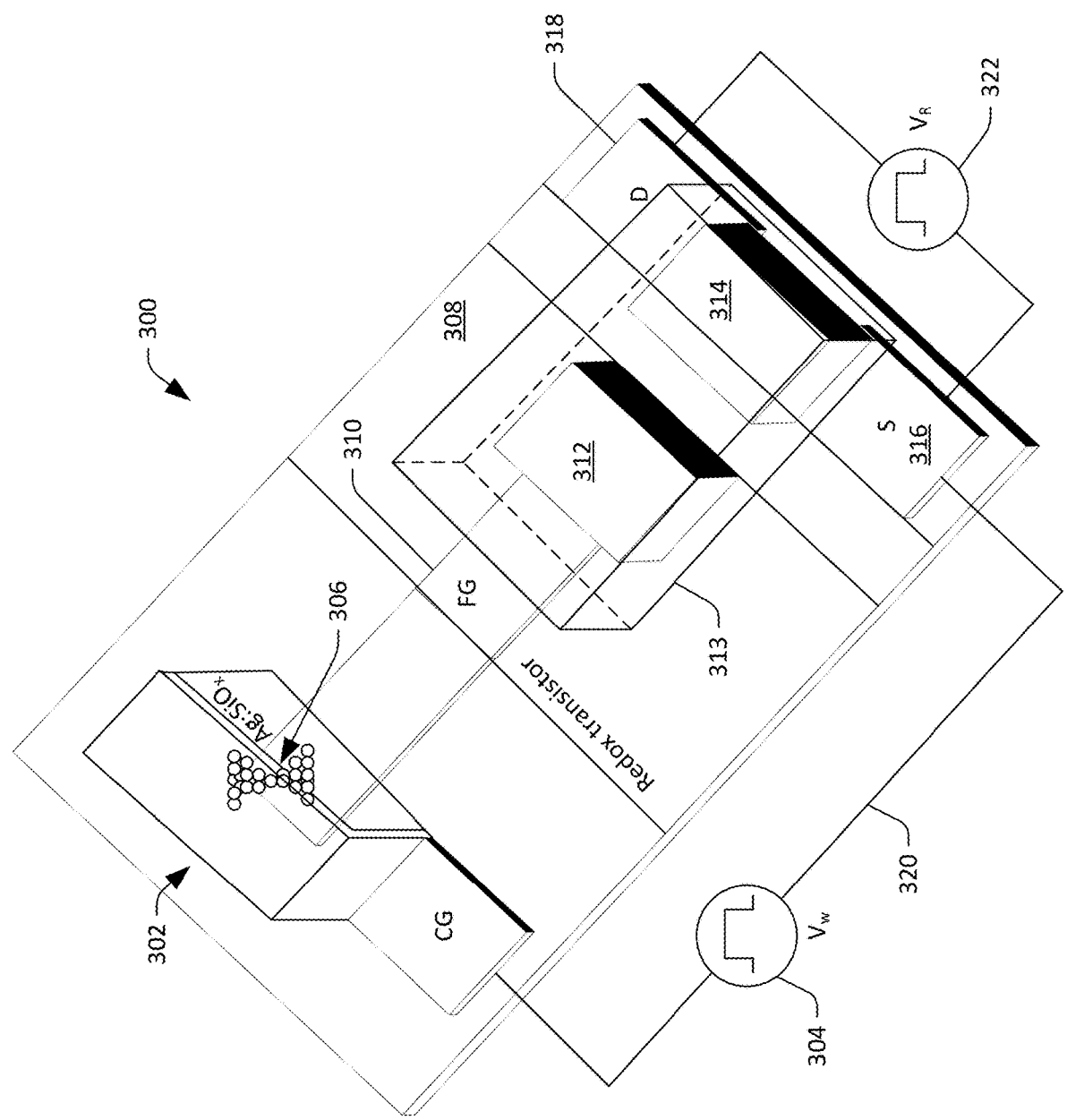
FIG. 3 is an isometric view of an exemplary IFG memory device.

With reference now to FIG. 3, an isometric view of an exemplary IFG memory device 300 is illustrated. As illustrated, the IFG memory device 300 includes a diffusive memristor 302, which is electrically coupled to a voltage source 304. The voltage source 304 is configured to emit voltage pulses having a magnitude of at least $V_w$, wherein $V_w$ is a voltage necessary to form a filament 306 in the diffusive memristor 302. The diffusive memristor 302 is electrically coupled to a redox transistor 308, wherein the redox transistor 308 includes a floating-gate electrode 310. A first storage element 312 is electrically coupled to the floating-gate electrode 310, wherein the first storage element 312 is configured to emit and accept ions as a function of magnitude and duration of a voltage pulse emitted from the voltage source 304 and applied to the diffusive memristor 302 (e.g., the first storage element is configured to emit and accept ions responsive to current entering the floating-gate 310 of the redox transistor 308).

The redox transistor 308 also includes an electrical insulator 313 and a second storage element 314, wherein the first storage element 312 and the second storage element 314 are encapsulated by the electrical insulator 313, and further wherein the storage elements 312 and 314 are separated from one another by a portion of the electrical insulator 313. As described previously, the electrical insulator 313 can be a solid electrolyte, such as Nafion or LiPON. The redox transistor 308 further includes a source electrode 316 and a drain electrode 318, wherein the channel of the redox transistor 308 comprises the second storage element 314. In an exemplary embodiment, the source electrode 316 and the drain electrode 318 can be composed of gold, although other conductive metals may be employed.

The IFG memory device 300 additionally includes a conductive trace 320 that electrically couples the source electrode 316 to a gate of the diffusive memristor 302, such that when the filament 306 is formed, electrons emitted from the second storage element 314 can pass through the filament 306 and be accepted by the first storage element 312. The reverse is also true, such that electrons emitted by the first storage element 312 can pass through the filament 306 and be accepted by the second storage element 314. This exchange of electrons allows ions to pass between the first storage element 312 and the second storage element 314 through the insulator 313 positioned therebetween.

A second voltage source 322 can be coupled to the source and drain electrodes 316 and 318, such that a low read voltage can be applied across the channel (the second storage element 314). As indicated previously, a redox state of the second storage element 314 can be controlled such that the conductance of the second storage element 314 can be controlled. When the filament 306 of the diffusive memristor 302 dissolves (e.g., the voltage source 304 no longer applies a voltage of at least $V_w$ to the gate of the diffusive memristor 302), ions remained trapped in their respective storage elements 312 or 314 such that the memory device 300 is a non-volatile memory device.

Figure 4:
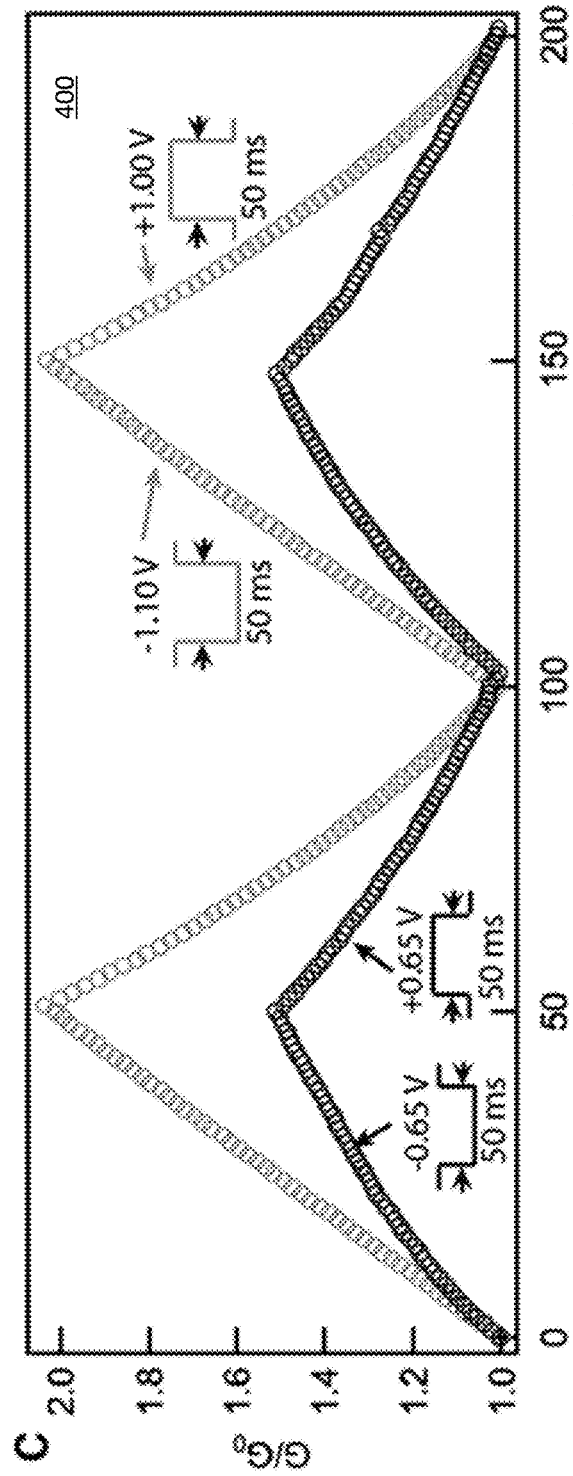
FIG. 4 is a plot that illustrates linear programmability of an exemplary IFG memory device.

As indicated previously, the IFG memory device 100 described herein exhibits characteristics that make it particularly well-suited for utilization in neuromorphic computing applications. With reference now to FIG. 4, an exemplary plot 400 is shown, wherein the plot 400 depicts conductance of an exemplary IFG memory device that is programmed through 50 analog states. In the exemplary plot 400, a potential voltage pulse of $V_w = -650$ mV in duration of $\tau_w = 50$ ms was used to switch the diffusive memristor to an ON state and to electronically drive de-protonation of the redox transistor channel. After each potential pulse, a subsequent read operation across the source drain terminals $V_{SD} = 25$ mV was used to measure an average increase in conductivity of 0.74 μS per write operation. The near constant increase of 0.74 μS for each write pulse resulted in a near-linear ramp in conductance. In the example employed to produce the plot 400, a 700 kΩ resistor was placed in series with the gate to limit the programming current in order to achieve 50 resistance levels in a 50×50 um (t=200 nm) device over a total range of 75 to 112 μS. After potentiation, 50 depression pulses of $V_w = +650$ mV and $\tau_w = 50$ ms protonated the channel with a near-symmetric decrease in conductivity of 0.74 μS per pulse. Similarly, hundreds of conductance states can be achieved with larger limit resistors and programming currents. As indicated previously, exemplary IFG memory devices can be programmed from voltages ranging from +/−0.2V to +/−1V. The linearity and symmetry observed during IFG programming are orders of magnitude better than existing PCM and Filament Forming Metal Oxides (FFMO) devices.

Figure 5:
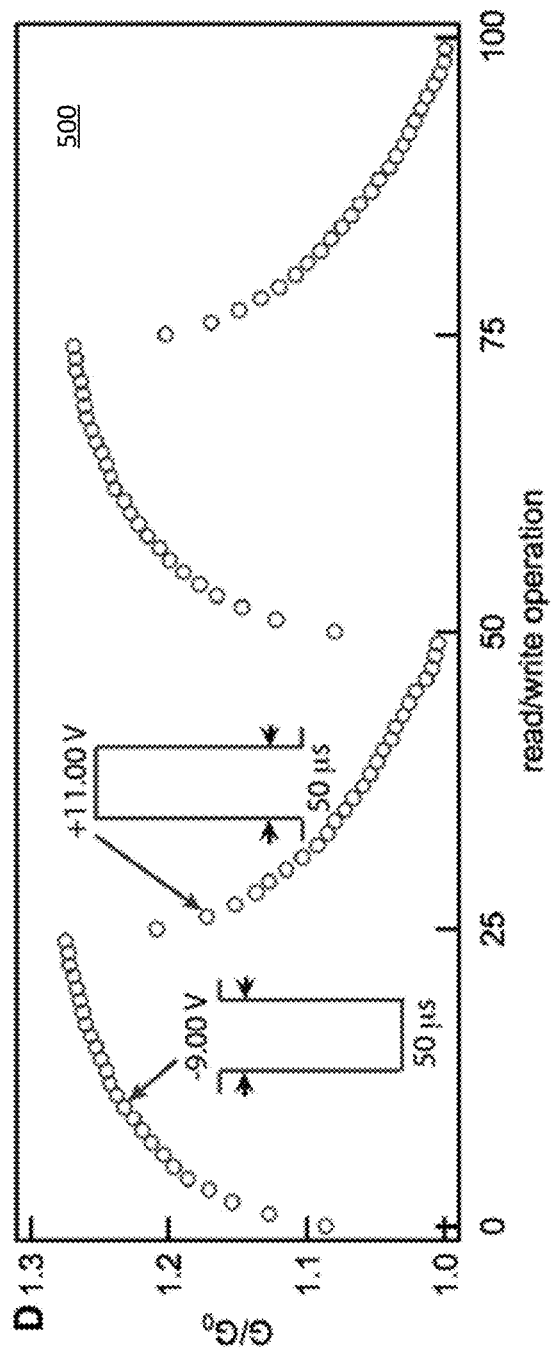
FIG. 5 is a plot that illustrates non-linear programmability of a conventional memory device.

Referring now to FIG. 5, a plot 500 illustrating programming of an exemplary CMOS memory device (based upon silicon oxygen nitrogen oxygen silica (SONOS) layers) is presented. SONOS is a commercial memory that has shown recent promise as a neuromorphic computing memory element. The plot 500 depicts a SONOS source drain conductance as it is programmed through 25 analog states. Although SONOS can be programmed with a modulation of $10^6$, a smaller range from 48 to 60 μs was required to improve linearity and still maintain reasonable signal-to-noise ratio. Programming at potentiation pulses $V_w = +9$ V and $\tau_w = 50$ μs produced a nonuniform increase in conductance that spanned two orders of magnitude from 3.20 μS at pulse 1 to 0.04 μS at pulse 25 with similar characteristics for depression ($V_w = -11$V and $\tau_w = 50$ μs). This nonuniformity in conductance can be attributed to the sensitivity of the programming current on the floating-gate voltage $V_{fg}$. During a write operation, electrons tunnel from the channel to accumulate at the floating-gate, which in turn shifts the threshold of the field effect transistor (FET) channel. Tunneling depends exponentially on the local electric field and, therefore, the amount of current injected is exponentially sensitive to any shift in $V_{fg}$. As a result, programming pulses of the same polarity become less effective during subsequent write pulses. This not only leads to the nonlinearity observed in read/write operations 1 to 25, but to an asymmetry at read/write operation 26. Both nonlinearity and asymmetry reduce accuracy in artificial neural network (ANN) performance.

As discussed previously, in contrast to SONOS, the IFG memory device 300, for example, relies upon diffusive filament formation for programming with a sharp voltage threshold beyond which only the redox cell impedance (and any limit resistor) dictates the total current. Programming an IFG memory device by pulsing $V_w$ has been found to have nearly identical characteristics to current-controlled pulsing of an isolated redox transistor. This suggests that above a certain overpotential, the injected current can be approximated as $1 = (V_w - V_{fg})/Z$, where $V_{fg}$ is the floating gate potential and Z is the frequency dependent cell impedance. It has been found that over the programming range, $V_{fg}$ shifts from about −50 mV to +50 mV. For IFG, programming is only linearly sensitive to shifts in $V_{fg}$ is found to give at most a 2× variation in the conductance change per pulse, leading to significant improvement over SONOS, which varied by two orders of magnitude. The shift in $V_{fg}$ is dictated by the redox-cell Gibb's free energy, which depends on the relative degree of channel and gate oxidation. Redox transistors composed of other ion-insertion electrodes with smaller changes in the Gibb's free energy could further improve the linearity. For example, based on previously measured electronic conductivity versus Li content, $LiCoO_2$ electrodes should shift <25 mV with a >10× swing in conductance and minimal changes to the cell impedance. Still, other ion-insertion electrodes, such as $Li_4Ti_5O_{12}$, undergo phase separation and maintain a constant Gibbs free energy at varying degrees of oxidation. In principle, an IFG memory device based upon such electrodes can be programmed with voltages that approach the lower end of demonstrated diffusive memristor thresholds (<200 mV) and still provide the linearity required for ANN accuracy.

Figure 6:
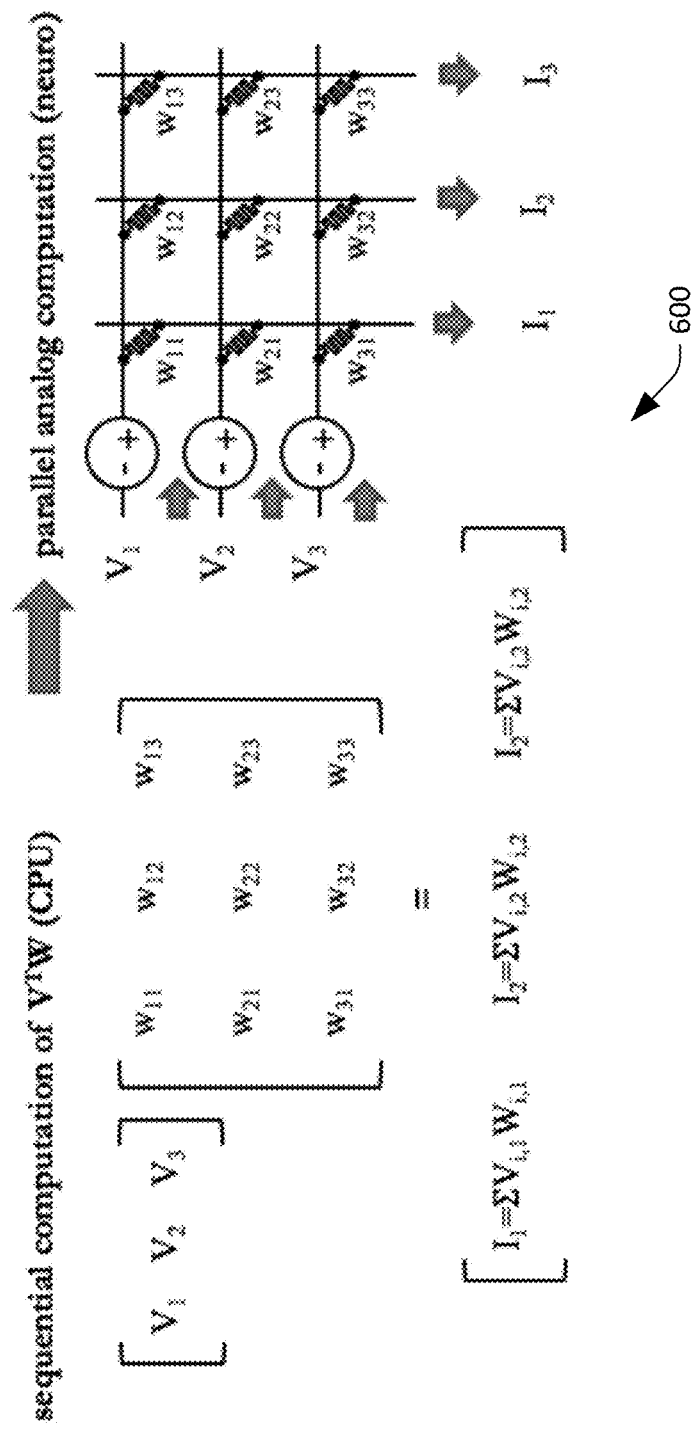
FIG. 6 illustrates an exemplary conventional sequential matrix operation and its corresponding parallel analog computation.

With reference now to FIG. 6, a diagram illustrating distinctions between a sequential matrix operation performed by a conventional computing device when executing an ANN algorithm compared and an analog operation that can be undertaken in parallel is depicted. When a matrix operation is undertaken sequentially, individual elements must be computed and stored in memory and then summed (e.g., a sequential multiply and accumulate operation is performed). In contrast, using a cross bar arrangement (e.g., were resistances are read from the channels of IFG memory devices), the multiple and accumulate operation can be performed in parallel by summing resistances across lines. Hence, a neuromorphic computer can include a matrix of IFG memory device elements, coupled through a modified cross-bar arrangement as shown in FIG. 7.

Figure 7:
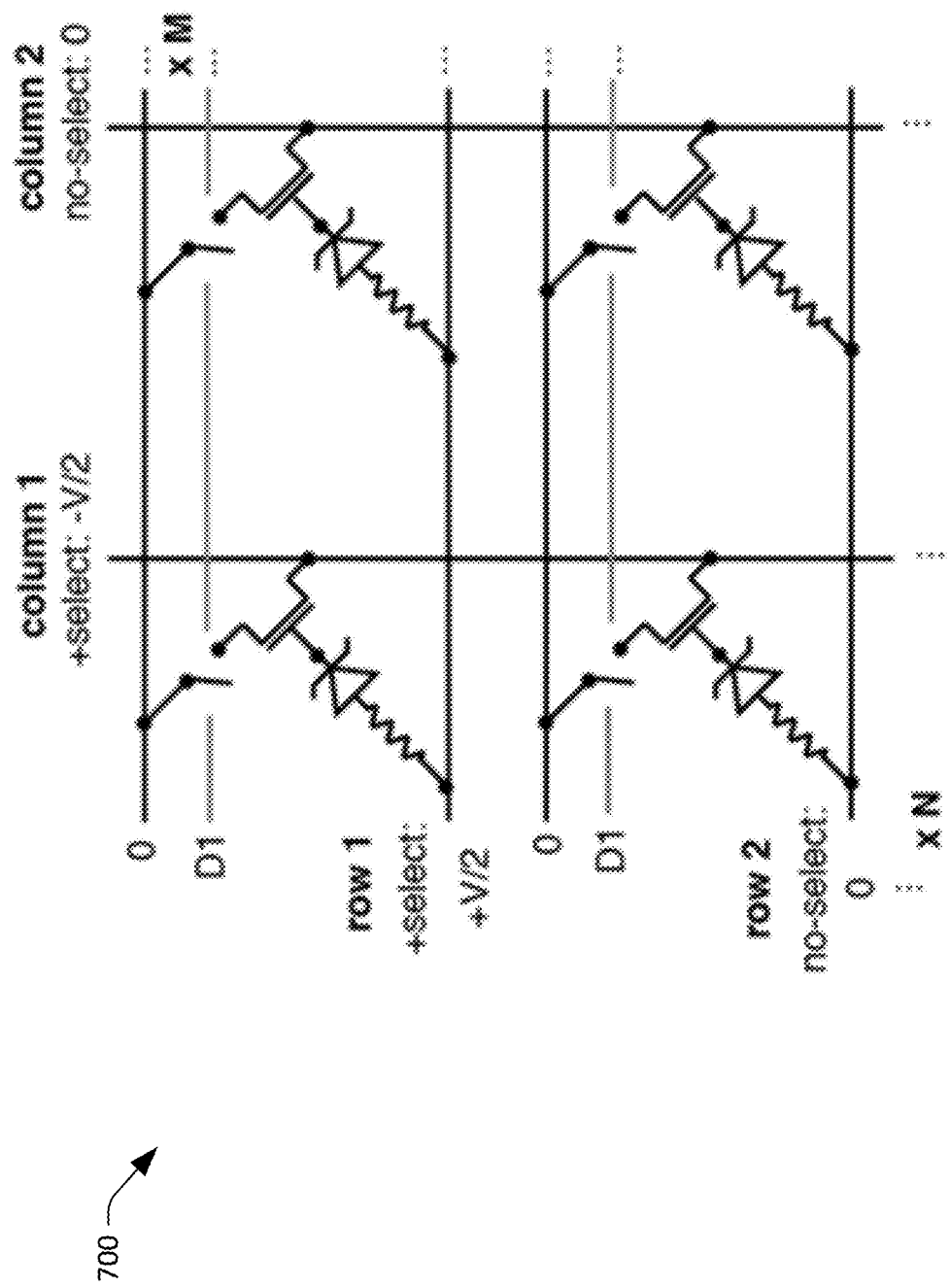
FIG. 7 illustrates an exemplary matrix of IFG memory device elements that is well-suited for use in a neuromorphic computer.

FIG. 7 depicts a plurality of IFG memory devices (with circuit equivalents shown) as elements in a modified crossbar ANN. In the diagram shown in FIG. 7, an additional line is included for purposes of programming. This allows for IFG memory device elements to be independently programmed and further independently read. This addresses deficiencies associated with neuromorphic computing devices that include memory elements that have only two terminals, as reading from and writing to memory elements on the same line may result in an inherently high energy and non-linear memory system.

Figure 8:
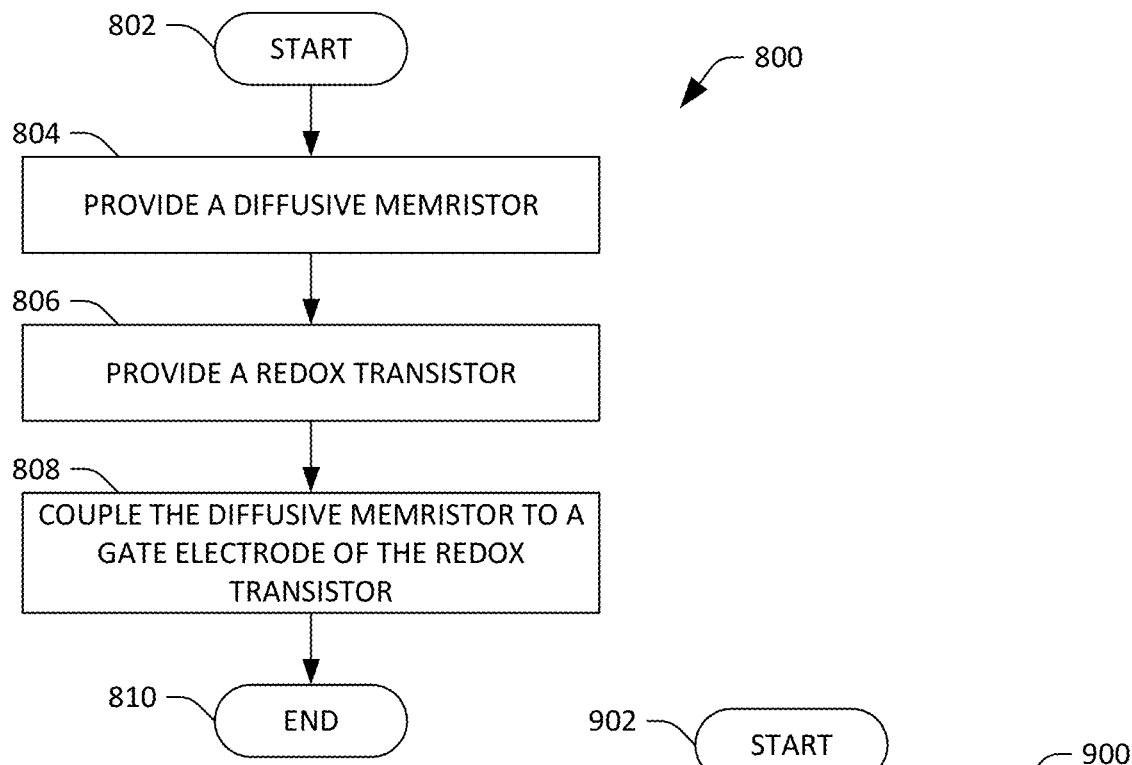
FIG. 8 is a flow diagram that illustrates an exemplary methodology for constructing an IFG memory device.
Figure 9:
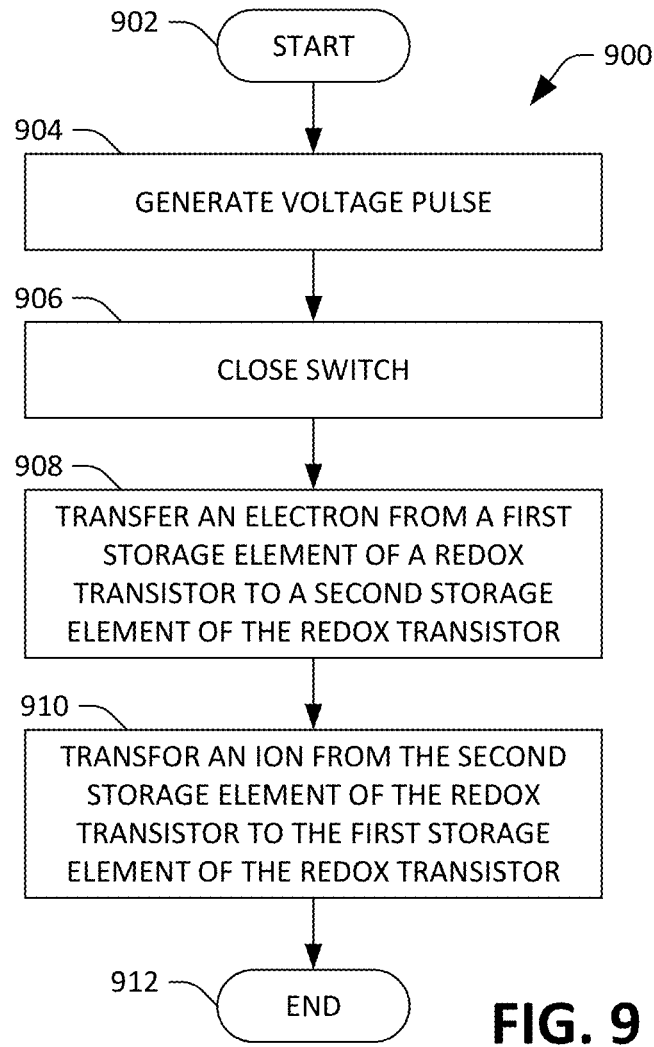
FIG. 9 is a flow diagram illustrating an exemplary methodology for operating an IFG memory device.
Figure 10:
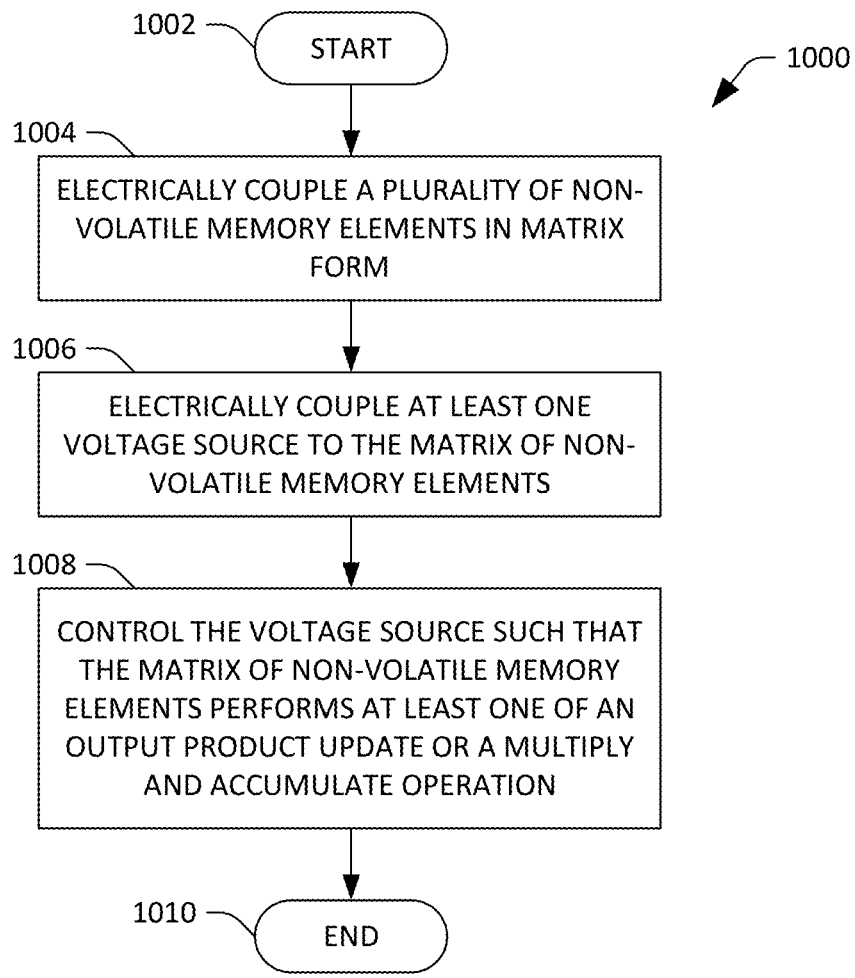
FIG. 10 is a flow diagram illustrating an exemplary methodology for constructing and employing a matrix of IFG memory devices in a neuromorphic computer.

FIGS. 8-10 illustrate exemplary methodologies relating to IFG memory devices. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Now referring to FIG. 8, a flow diagram illustrating an exemplary methodology 800 for forming an IFG memory device is illustrated. The methodology 800 starts at 802, and at 804, a diffusive memristor is provided. At 806, a redox transistor is provided, wherein the redox transistor comprises a gate electrode, a source electrode, a drain electrode, and a channel between the source electrode and the drain electrode, and further wherein the channel comprises a storage element composed of a material (e.g., an organic polymer). At 808, the gate electrode of the redox transistor is coupled to the switch, wherein the storage element is configured to emit and accept ions as a function of a current entering the gate electrode when the gate electrode is coupled to the switch, and further wherein a state of the IFG memory device is a function of a a redox state of the storage element. The methodology 800 completed at 810.

With reference now to FIG. 9, a flow diagram illustrating an exemplary methodology 900 for operating an IFG memory device is illustrated. The methodology 900 starts at 902, and at 904 a voltage pulse is generated. For example, the voltage pulse may have a magnitude of between 0.2 V and 0.6 V. At 906, a switch is closed responsive to receipt of the voltage pulse. As described previously, the switch can be a diffusive memristor, and a filament is formed in the diffusive memristor when a magnitude of the voltage pulse exceeds a threshold. At 908, an electron is transferred from a first storage element of the redox transistor to a second storage element of the redox transistor, wherein the two storage elements are separated by an electrical insulator, such as Nafion. At 910, an ion is transferred from the second storage element of the redox transistor to the first storage element of the redox transistor, thereby altering the conductance of both the first storage element and the second storage element (and thus altering a state of the IFG memory device). The methodology 900 completed 912.

Now referring to FIG. 10, a flow diagram illustrating an exemplary methodology 1000 for forming and operating and anamorphic computing device is illustrated. The methodology 1000 starts at 1002, and at 1004 a plurality of IFG memory devices are coupled in a matrix form. At 1006, at least one voltage source is coupled to the matrix of IFG memory devices, and at 1008, the voltage source is controlled such that the matrix of IFG memory devices performs at least one of an output product update or a multiply and accumulate operation. The output product update is often used in back propagation algorithms when training an ANN, while a multiply and accumulate operation is used in a forward propagation algorithm for when the ANN generates outputs. The methodology 1000 completed 1010.

Examples

To investigate the performance of IFG memory devices, redox transistors were electrically connected with ion insertion electrodes (storage elements) composed of a polymer PEDOT:PSS/PEI blend and a solid electrolyte of Nafion to diffusive memristor composed of a $Pt/Ag/SiO_xN_y/Ag/Pt$ stack. The redox transistor had symmetrically doped gate and channel (areas of 50 μm×50 μm, thickness 300 nm). The diffusive memristor was specially optimized to execute fast switching at low voltage while retaining a large ON/OFF ratio. For the constructed IFG memory device, the state of the PEDOT:PSS/PEI channel determines the resistance state, while the floating gate acts as a reservoir of ions that is separated from the channel by the electronically-insulating but ionically-conductive electrolyte. The diffusive memristor, like the control gate in FLASH memory, is used to mediate the electronic coupling to the floating gate.

To demonstrate performance of the IFG memory device in ANNs, a simulation was undertaken, where the IFG memory device described above was simulated as an element in a crossbar neural network used for executing the backpropagation algorithm. For the simulations, a three-layer network (one hidden layer) was used for training against three data sets: an 8×8 pixel image version of handwritten digits, a 28×28 pixel version of handwritten digits, and a file classification data set. To account for noise, non-linearity and asymmetry in programming, a statistical distribution of IFG conductance levels from over 5,000 switching events was acquired. These probability distributions were used to generate a lookup table used during weight updates in the network simulation. The resulting network accuracies were determined for different numbers of training epochs. In each case, the network reached within 2% of ideal accuracy (an improvement upon known simulations that are based upon SONOS, PCM, or FFMO memory devices).

Simulations also indicate that ANNs represented through IFG memory devices can be scaled to large arrays and still achieve high accuracy, because write and read currents can be reduced <10 nA without sacrificing signal to noise. To support a 1000×1000 crossbar with a fully parallel read or write, each device can have a maximum read or write current of 10 nA in order to reduce parasitics. While redox transistors have already shown write currents <10 nA, low read currents have yet to be demonstrated. To address this, formulations of diluted PEDOT:PSS were explored to achieve an average channel resistance of 100 MΩ with read currents less than 5 nA. The constructed IFG memory devices had a high signal to noise ratio and preserved a linear and symmetric programmability. On the other hand, FFMO devices cannot achieve both high resistance and low noise because of the quasi one-dimensional nature of electronic transport through filaments, where the number of conductance channels approach the conductance quantum $G_0=2e^2/h$. Thus, compared to the constructed IFG memory devices, FFMO devices are associated with less accuracy.

In addition to high resistance, write endurance is critical for memory devices used in training accelerators that will require many thousands of updates per training epoch. Diffusive memristors have been demonstrated with endurance as high as $10^8$, which is greater than that of FLASH memories that are sensitive to oxide stresses. Therefore, to understand the endurance of limits of IFG memory devices, extended write cycling of a redox transistor was carried out. Of the two randomly selected devices that were used for endurance testing, neither exhibited degradation after over $10^6$ read-write operations.

Write selectivity is additionally required for massively parallel write operations in an outer-product update. Returning to FIG. 7, such figure illustrates a circuit-level schematic of an IFG memory device crossbar array with an access device (or diffusive memristor) at every cell to enable write selectivity and prevent discharge to retain memory. For use in a training accelerator, the crossbar is considered as part of a "neural core" that is used to execute matrix operations while external electronics are used to process the inputs and outputs as part of a "digital core". FIG. 7 illustrates an outer product update at the circuit-level, with the conductance states programmed by the voltages dropped across the rows and columns. In the example depicted in FIG. 7, the element (1, 1) is selected for potentiation, or "+select", with +V/2 along column 1 and −V/2 along row 1. For this write scheme, the total programming voltage V must overcome the diffusive memristor threshold for the ON state in order to program, while V/2 must be below the ON threshold. This ensures that unlike "+select" element (1, 1), the "no-select" elements see only V/2 across the source to gate, and therefore no programming current can pass to cause write disturb. To demonstrate this concept experimentally, circuit elements were connected in a 1×2 prototype "IFG array", and the write scheme illustrated in FIG. 7 was tested. The testing indicated that elements can be independently programmed without disturbing other elements in the array. To compensate for parasitic losses, crossbars based upon FFMO devices have only shown parallel programming along a single column to accelerate O(N) calculations. The selectivity of IFG combined with low currents and low voltage operation should support fully parallel writes along both rows and columns to accelerate $O(N^2)$ calculations.

In the crossbar depicted in FIG. 7, a read-select transistor (shown as a switch) and limit resistor is used at every cell, but appropriately designed IFG devices may eliminate the need for these additional circuit elements completely. The transistor was used to prevent current flow across the PEDOT:PSS/PEI channels during write operations, which was found to cause state disturb due to a contact charging effect. The ON/OFF ratio of the read-select transistor need only reach $10^4$, and therefore all-polymer devices can be utilized, which would not inhibit 3D stacking. Furthermore, each transistor need not be accessed via an independent line, and were programmed globally between the read and write operation without sacrificing parallelism. The need for an extra transistor may be eliminated by utilizing other ion-insertion electrodes (storage elements) that do not exhibit contact charging effects such as other redox active polymers or metal oxides. The other additional circuit element, the limit resistor, was used in order to finely tune conductance levels over the same range for a variety of devices at constant pulse widths $\tau_W=50$ ms. However, redox transistors can also be programmed at speeds approaching the RC cutoff in order to achieve finely spaced levels without the need for additional cell impedance. This would still be compatible with large arrays so long as the programming current does not exceed 10 nA.

Three factors determine the retention for IFG memory devices: 1) electronic leakage through the electrolyte; 2) electronic leakage through the threshold switch; and 3) environmental oxidation. Previously, redox transistors based upon PEDOT:PSS/PEI and a liquid electrolyte were found with retention times >24 hours, and devices based upon Li were found to have retention of several weeks. For devices with Nafion electrolyte, state decay on a timescale of a few minutes was observed. Although that is two orders of magnitude greater than the demonstrated learning rate (50 ms), longer retention periods are desirable, even for a training accelerator. In order to study this effect, reducing agents were incorporated into the polymer films, out-diffusion of electrostatically unbound PEI was promoted, and the devices were encapsulated. After implementing these strategies, Nafion-based devices were found to have an even longer retention period of $\tau_R=5$ hours. This suggests the retention of large IFG memory devices (e.g., 50 μm×50 μm×300 nm) is primarily due to environmental oxidation of the PEDOT:PSS/PEI. Further improvements in the encapsulation process may eliminate the environmental oxidation altogether, and thus retention times may be dictated by the OFF resistance of the diffusive memristor and the charge capacity of a scaled redox transistor.

The retention and speed of scaled IFG devices will dictate the application space for an IFG-based accelerator. For example, accelerators used as embedded dot product engines may require >10 year retention, whereas accelerators used primarily for training only require retention as long as the training period, after which weights can be offloaded to a digital core. IFG memory device switching speed is projected to scale linearly with device area to approximately 1 μm dimensions due to the dominant capacitive behavior of the PEDOT:PSS channel material. Below 1 μm it is possible that the proton drift time will exceed the RC charging time, giving a switching limit of roughly 150 ns for a 300×300 nm (t=200 nm) device. Diffusive memristors with a low activation energy for ion motion $E_a\sim10$ kT have demonstrated similar switching speeds, and can be quickly switched ON and return back to the OFF state spontaneously under zero bias in less than <100 ns. However, a 300×300 nm device may be limited to switching speeds of approximately 1 µs to maintain <10 nA of programming current and smaller device areas may be desirable for higher speeds in large arrays. Although the diffusive memristor ON/OFF range of $10^{10}$ is more than large enough to support 1 µs programming currents for scaled devices, the OFF resistance may limit retention periods. Bulk ion-insertion can increase the charge density per analog state $10^3$ by storing charges in the bulk instead of in traps or at interfaces (i.e. SONOS), and therefore the OFF requirements are not as strict as for CMOS memories. For the 300×300 nm device, a $10^{13}\Omega$ diffusive memristor OFF resistance can give a 4 s retention period, about two orders of magnitude greater than DRAM refresh rates.

Finally, the overall energy efficiency of a potential IFG training accelerator was considered, including: parasitics, the crossbar circuit overheads, and processing by an external digital core. To out-perform an optimized digital accelerator, the crossbar should minimize circuit parasitics with low currents to minimize the I×V power and low voltages to minimize the $CV^2$ energy. Tested IFG memory devices can meet the necessary requirements for a 1000×1000 array with switching voltages <1V and scaled write and read currents <10 nA. Thus, the energy of a training accelerator becomes dominated by analog-to-digital conversion and the analog integrator in the circuit overheads. Therefore, when implemented into an training accelerator according to the design illustrated in FIG. 7, IFG memory device arrays can provide roughly 2 to 3 orders of magnitude reduction in energy and latency when compared to an optimized digital accelerator. Write times for IFG memory devices can be lowered to <1 µs through scaling. Finally, the larger area of a three terminal IFG memory device compared to RRAM is not an issue, as the crossbar circuit overheads are far larger than the memory elements. IFG memory devices can be built on top of the drive transistors, where the area of an IFG array just needs to be smaller than the drive transistor area. For a 1024×1024 array, each IFG memory device only needs to be smaller than 0.07 m², roughly what is anticipated for scaled IFG devices based upon PEDOT:PSS/PEI. In addition, there is no single crystalline materials required for the IFG memory devices, which may enable in 3D integration to further increase density.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A non-volatile memory device comprising:
   a threshold switch; and
   a redox transistor that is electrically coupled to the switch, wherein the redox transistor comprises:
   a gate electrode that is coupled to the switch;
   a source electrode;
   a drain electrode; and
   a channel between the source electrode and the drain electrode, wherein the channel comprises a storage element composed of a material, the storage element is configured to emit and accept ions as a function of current that enters the gate electrode, and further wherein a state of the non-volatile memory device is a function of a redox state of the channel electrode.

2. The non-volatile memory device of claim 1, wherein the ions are hydrogen ions.

3. The non-volatile memory device of claim 1, wherein the switch is a diffusive memristor.

4. The non-volatile memory device of claim 3, wherein the diffusive memristor comprises a Pt/Ag/SiO$_x$N$_y$/Ag/Pt stack.

5. The non-volatile memory device of claim 1, further comprising:
   a second storage element coupled to the gate electrode, wherein the second storage element is composed of the material; and
   a solid electrolyte that is positioned between the storage element and the second storage element.

6. The non-volatile memory device of claim 5, the material being an organic polymer.

7. The non-volatile memory device of claim 6, wherein the organic polymer comprises poly(3,4-ethylenedioxythiophene) polystyrene sulfonate.

8. The non-volatile memory device of claim 5, the material being a transition metal oxide.

9. The non-volatile memory device of claim 5, wherein the material comprises at least one of $MoO_3$, $MoS_2$, graphene, $WO_3$, $TiO_2$, or $LiTiO_2$.

10. The non-volatile memory device of claim 8, wherein the electrolyte comprises Nafion.

11. The non-volatile memory device of claim 1, wherein the threshold switch is one of a transistor, a vertical Si transistor, a Si PN diode, a Si Punchthrough diode, an Oxide PN diode, an Oxide/Nitride Schottky barrier, a varistor-type bidirectional switch, a chalcogenide threshold switch, a metal insulator metal switch, a threshold vacuum switch, or a mixed ionic electronic selector (MIEC).

12. The non-volatile memory device of claim 1, wherein the state of the non-volatile memory is configured to be altered in response to a voltage of between 0.2V and 1V being applied to the switch.

13. The non-volatile memory device of claim 1, wherein the non-volatile memory device is included in an array of identical non-volatile memory devices, and further wherein a hardware artificial neural network comprises the array of identical non-volatile memory devices.

* * * * *